(12) United States Patent
Wang et al.

(10) Patent No.: US 8,255,853 B2
(45) Date of Patent: Aug. 28, 2012

(54) CIRCUIT EMULATION SYSTEMS AND METHODS

(75) Inventors: MingYang Wang, Lafayette, CA (US); Sweyyan Shei, Cupertino, CA (US); Hwa Mao, Taipei (TW)

(73) Assignees: SpringSoft USA, Inc., San Jose, CA (US); SpringSoft, Inc., Hsinchu (TW)

( * ) Notice: Subject to any disclaimer, the term of this patent is extended or adjusted under 35 U.S.C. 154(b) by 197 days.

(21) Appl. No.: 12/756,990

(22) Filed: Apr. 8, 2010

(65) Prior Publication Data

US 2011/0251836 A1    Oct. 13, 2011

(51) Int. Cl.
*G06F 17/50* (2006.01)

(52) U.S. Cl. .................. 716/116; 716/117; 716/121

(58) Field of Classification Search .................. 716/116, 716/117, 121
See application file for complete search history.

(56) References Cited

U.S. PATENT DOCUMENTS

| | | | | |
|---|---|---|---|---|
| 5,802,290 | A * | 9/1998 | Casselman | 709/201 |
| 6,377,911 | B1 | 4/2002 | Sample et al. | |
| 6,754,763 | B2 | 6/2004 | Lin | |
| 7,072,825 | B2 | 7/2006 | Wang et al. | |
| 7,117,143 | B2 | 10/2006 | Wang et al. | |
| 7,120,571 | B2 | 10/2006 | Shei et al. | |
| 7,607,005 | B1 * | 10/2009 | Lewis | 713/100 |
| 2002/0162084 | A1 | 10/2002 | Butts et al. | |
| 2003/0154458 | A1 | 8/2003 | Butts et al. | |
| 2004/0254906 | A1 | 12/2004 | Shei et al. | |
| 2006/0015313 | A1 | 1/2006 | Wang et al. | |

* cited by examiner

*Primary Examiner* — Vuthe Siek
*Assistant Examiner* — Brian Ngo
(74) *Attorney, Agent, or Firm* — Finnegan, Henderson, Farabow, Garrett & Dunner, LLP

(57) ABSTRACT

An apparatus for circuit emulation may include a first circuit board, one or more circuit emulation resource on the first circuit board, a first interconnection interface on the first circuit board, and a second interconnection interface on the first circuit board. The first circuit board may include conductive wiring paths. The circuit emulation resource is on the first circuit board and coupled with a portion of the conductive wiring paths, with each circuit emulation resource being configured to emulate a portion of an electronic circuit by receiving input signals and producing output signals in response to the input signals. The first interconnection interface is on the first circuit board and coupled with at least a first portion of the circuit emulation resource, The first interconnection interface may be configured to couple with an interconnection interface of a second circuit board having a second group of conductive wiring paths and having a second group of circuit emulation resources. The second interconnection interface is on the first circuit board and coupled with at least a second portion of the at least one circuit emulation resource. The second interconnection interface may be configured to couple with an interconnection interface of a third circuit board having a third group of conductive wiring paths and having a third group of circuit emulation resources.

33 Claims, 13 Drawing Sheets

CIRCUIT EMULATION SYSTEMS AND METHODS

TECHNICAL FIELD

This disclosure relates to circuit emulation systems and methods, and in particular to circuit boards suitable for emulation systems and methods employing resources such as programmable logic devices or other devices.

BACKGROUND

Circuit emulation is a common and integral part of the process of designing and manufacturing integrated circuits (ICs), which are often mass produced, sold, and incorporated into systems in the form of semiconductor chips. As an illustrative example, an emulation system or simulator may be a hardware device that can be programmed to simulate a newly designed circuit. The programmed emulation system may then be used to verify the operational behavior of the circuit to see if the circuit properly functions for its intended purposes without errors. The signals flow internally within the emulated circuit and the signal inputs and outputs of the emulated circuit may be monitored for the purpose of verifying operational behaviors, identifying errors that may occur, and correcting design or functional flaws.

An IC designer may use an emulation system at various stages of a design process to verify that the IC will function and behave as expected. As an example, a designer may develop a "test bench" for an emulation system by programming it to simulate an IC device under test (DUT). The system may indicate how the various internal or external signals of the DUT change states over time and allow the monitoring of these various signals and the behaviors of the DUT during the emulation, such as how the DUT responds to various input signals. As an example, the system may generates a "dump file" containing waveform data representing the time-varying behaviors of monitored signals. The designer may then use various examination or debugging tools to analyze the dump file and determine whether the DUT behaved as expected.

As an illustrative example, FIG. 1 illustrates a prior-art emulation system or emulator 10 including a set of sectional circuit boards 12 each holding an array of programmable gate arrays (FPGAs) 14, each of which may be programmed to emulate the logic of a large number of interconnected logic gates, flip-flops, registers, etc. Each FPGA 14 may have many I/O (input/output) terminals, and some of those I/O terminals are linked to the I/O terminals of other FPGAs 14 on the same circuit board 12 so that the FPGAs can communicate with one another. In one embodiment, these sectional circuit boards 12 may reside in slots on a main circuit board (or motherboard) 15, which may include a backplane for interconnecting I/O terminals of FPGAs 14 residing on different circuit boards 12 so that they too can communicate with one another.

Coupled with motherboard 15 through an I/O interface 17, workstation 16 may process the user's description of a DUT to program FPGAs 14 to emulate DUT logic and transmits those instructions to programming inputs of FPGA 14. I/O interface 17 may be an I/O interface card 17 that may be installed in workstation 16, such as in a slot of the PCI bus of workstation 16. Each I/O interface card 17 may transmit signals to and receive signals from resources mounted on motherboard 15 via signal paths motherboard 15 provides.

In addition to logic, FPGAs 14 can emulate ICs including large standardized components such as embedded computer processors and memories. The ICs and large standardized components can be emulated by processors or memory ICs mounted on "resource boards" 18 that may also be installed in slots of motherboard 15. Backplane wiring on motherboard 15 may link terminals of the devices mounted on resource boards 18 to I/O terminals of various FPGAs 14 mounted on FPGA boards 12.

An IC is often designed to be installed on a circuit board of an external system so that it can communicate with other devices within that system. When emulator 10 acts as an in-circuit emulation (ICE) system, the emulator may include an external system interface circuit 22 providing signal paths between I/O terminals of FPGAs 14 and a socket of the external system 24 of the type in which the IC being emulated will eventually reside. A cable 27 interconnects interface 22 with external system 24 and typically includes a connector that fits into the IC socket.

Emulation system 10 may also include pattern generation and data acquisition circuits 26 on motherboard 15. Pattern generation and data acquisition circuits 26 may be coupled with some of the signals paths on the motherboard or to I/O terminals of FPGAs 14 and may supply input signals to the FPGAs and monitor selected FPGA output signals during the emulation process to acquire "probe data" representing the behavior of the DUT output signals.

As another illustrative example, FIG. 2 illustrates a prior-art emulator architecture 20. Referring to FIG. 2, resource cards 28 may be mounted in slots of a workstation 33 and may emulate some portions of a DUT while workstation 33 emulates other portions of the DUT. Each card 28 may include an array of interconnected FPGAs 14 and may include other resources 30 such as memories linked to I/O terminals of FPGAs 14. An I/O interface circuit 32 in each card 28 may include I/O terminals connected to many I/O terminals of FPGAs 14. Workstation 33 may send instructions via its communication bus to the I/O interface circuit 32 on each card 28.

When the complexity of an emulated circuit increases, it may become necessary to use or combine multiple circuit boards, such as circuit board 12, main circuit board or motherboard 15, and resource board 18 in FIG. 1. Circuit boards may be stacked vertically and communicate using a shared communication bus. However, the limited number of channels or signal paths available on the shared communication bus may limit the number of signals that can be exchanged or monitored at the same time. For example, FIG. 3 is a diagram illustrative of a multiple-circuit-board system in the prior art. The circuit boards 60A, 60B, 60C, and 60D communicate with each other using a shared communication bus 62, which provides a limited number of channels or signal paths. As the complexity of a simulated circuit increases, so does the number of signals to be exchanged or monitored. The limitation on the number of channels or signal paths may limit the number of input signals to and output signals from the simulated circuit and may limit a designer's ability to effectively monitor the operations of the simulated circuit in certain emulation scenarios.

SUMMARY

Consistent with the disclosed embodiments, an apparatus for circuit emulation may include a first circuit board, one or more circuit emulation resource on the first circuit board, a first interconnection interface on the first circuit board, and a second interconnection interface on the first circuit board. The first circuit board may include conductive wiring paths. The circuit emulation resource is on the first circuit board and coupled with a portion of the conductive wiring paths, with each circuit emulation resource being configured to emulate a portion of an electronic circuit by receiving input signals and producing output signals in response to the input signals. The first interconnection interface is on the first circuit board and coupled with at least a first portion of the circuit emulation resource, The first interconnection interface may be configured to couple with an interconnection interface of a second circuit board having a second group of conductive wiring paths and having a second group of circuit emulation resources. The second interconnection interface is on the first circuit board and coupled with at least a second portion of the at least one circuit emulation resource. The second interconnection interface may be configured to couple with an interconnection interface of a third circuit board having a third group of conductive wiring paths and having a third group of circuit emulation resources. In one embodiment, the first and second interconnection interfaces may have non-overlapped signaling paths and provide at least a structural support for coupling the first, second, and third circuit boards and enabling structural stackability of the apparatus for circuit emulation. In other words, the first interconnection interface may have one or more signaling paths that are not overlapped with (or independent from) the signaling paths of the second interconnection interface, and the first and second interconnection interfaces may provide the structural support for allowing the structural expandability or stackability of the apparatus for circuit emulation.

Consistent with the disclosed embodiments, a method for performing circuit emulation may include: configuring at least one circuit emulation resource on a first circuit board having a first group of conductive wiring paths, the circuit emulation resource being coupled with a portion of the conductive wiring paths of the first group of conductive wiring paths, each circuit emulation resource being configured to emulate a portion of an electronic circuit; coupling a first interconnection interface on the circuit board with an interconnection interface of a second circuit board having a second group of conductive wiring paths and having a second group of circuit emulation resources, wherein the first interconnection interface is coupled with at least a first portion of the at least one circuit emulation resource; coupling a second interconnection interface on the circuit board to an interconnection interface of a third circuit board having a third group of conductive wiring paths and having a third group of circuit emulation resources, wherein the second interconnection interface is coupled with at least a second portion of the at least one circuit emulation resource; providing input signals to the at least one circuit emulation resource to emulate a portion of an electronic circuit; and receiving output signals the at least one circuit emulation resource produces in response to the input signals to perform circuit emulation. In one embodiment, the first and second interconnection interfaces may have non-overlapped signaling paths and provide at least a structural support for coupling the first, second, and third circuit boards and enabling structural stackability of the apparatus for circuit emulation. In other words, the first interconnection interface may have one or more signaling paths that are not overlapped with (or independent from) the signaling paths of the second interconnection interface, and the first and second interconnection interfaces may provide the structural support for allowing the structural expandability or stackability of the apparatus for circuit emulation.

Consistent with the disclosed embodiments, a method for making an integrated circuit may include performing circuit emulation. The circuit emulation may be performed with the steps of: configuring at least one circuit emulation resource on a first circuit board having a first group of conductive wiring paths, the circuit emulation resource being coupled with a portion of the conductive wiring paths of the first group of conductive wiring paths, each circuit emulation resource being configured to emulate a portion of an electronic circuit; coupling a first interconnection interface on the circuit board with an interconnection interface of a second circuit board having a second group of conductive wiring paths and having a second group of circuit emulation resources, wherein the first interconnection interface is coupled with at least a first portion of the at least one circuit emulation resource; coupling a second interconnection interface on the circuit board to an interconnection interface of a third circuit board having a third group of conductive wiring paths and having a third group of circuit emulation resources, wherein the second interconnection interface is coupled with at least a second portion of the at least one circuit emulation resource; providing input signals to the at least one circuit emulation resource to emulate a portion of an electronic circuit; and receiving output signals the at least one circuit emulation resource produces in response to the input signals to perform circuit emulation. In some embodiments, the method for making the integrated circuit may further include changing at least one of designs of the integrated circuit based on the circuit emulation and/or fabricating the integrated circuit after the circuit emulation. In one embodiment, the first and second interconnection interfaces may have non-overlapped signaling paths, non-overlapped signaling protocols and provide at least a structural support for coupling the first, second, and third circuit boards and enabling structural stackability of the apparatus for circuit emulation. In other words, the first interconnection interface may have one or more signaling paths that are not overlapped with (or independent from) the signaling paths of the second interconnection interface, and the first and second interconnection interfaces may provide the structural support for allowing the structural expandability or stackability of the apparatus for circuit emulation.

It is to be understood that both the foregoing general description and the following detailed description are exemplary and explanatory only and are not restrictive of the claimed embodiments.

BRIEF DESCRIPTION OF THE DRAWINGS

The accompanying drawings, which are incorporated in and constitute a part of this specification, illustrate embodiments consistent with the present disclosure and, together with the description, serve to explain the principles of the disclosed embodiments.

DESCRIPTION OF THE EMBODIMENTS

Reference will now be made in detail to exemplary embodiments, examples of which are illustrated in the accompanying drawings. The following description refers to the accompanying drawings, and the same numbers in different drawings represent the same or similar elements unless otherwise represented.

Exemplary embodiments provide emulation systems and methods. In the disclosed embodiments, a circuit board, such as a main circuit board, a resource board, a sectional circuit board, or a sub-board, may have one or more circuit emulation resources and two interconnection interfaces that may be coupled with other circuit boards that provide signal communications completely or partially independent of each other. The connection interfaces may allow the circuit boards to be stacked over each other or coupled with each other without being limited to a common and shared communication bus. In some embodiments, a "zigzag" architecture may be implemented to increase the number of independent signaling channels and increase the expandability, capacity, stackability, and/or scalability of an emulation system.

Figures 1, 2:
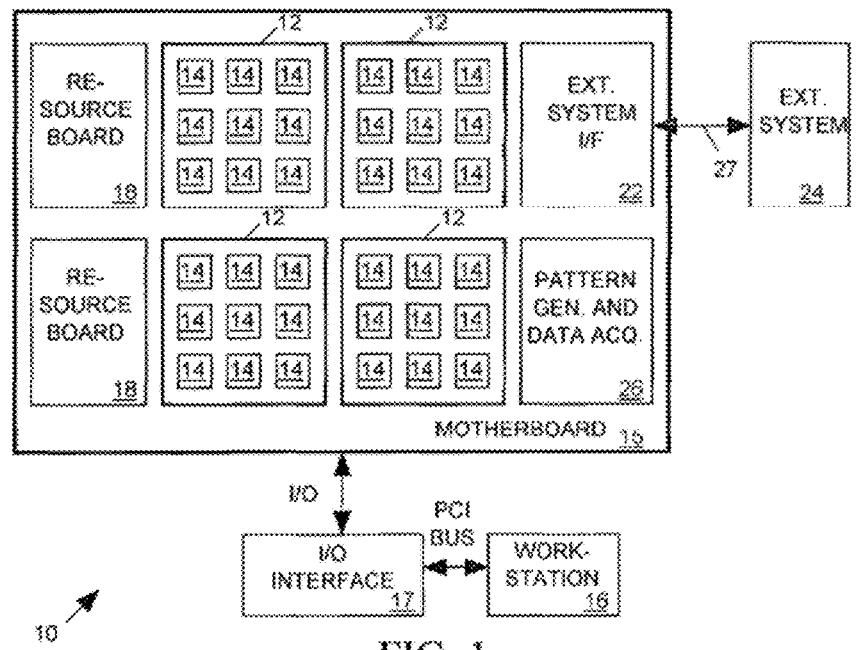
FIG. 1 illustrates an emulation system in the prior art.
FIG. 2 illustrates an emulator architecture in the prior art.
Figure 3:
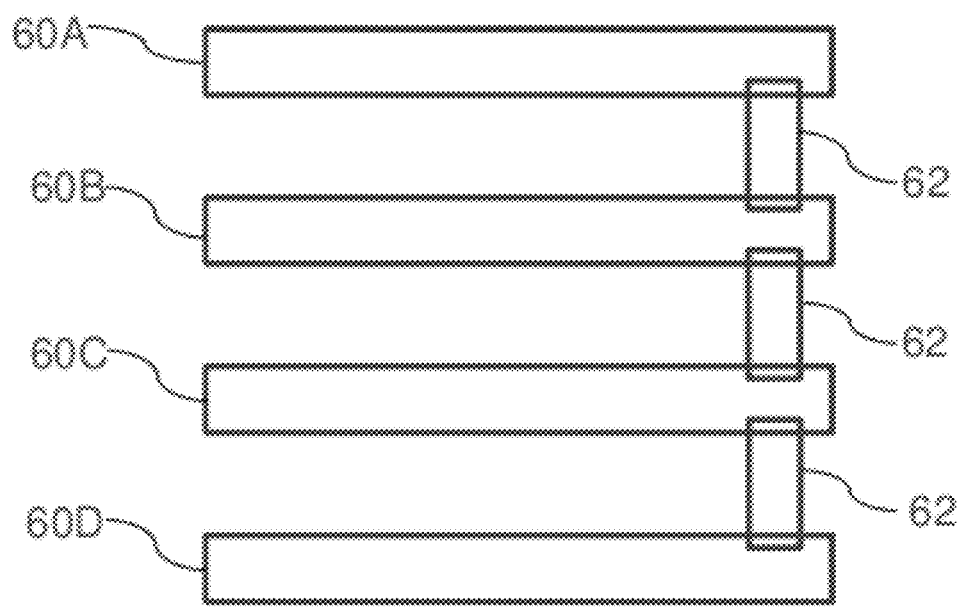
FIG. 3 is a diagram illustrative of a multiple-circuit-board system in the prior art.
Figure 4A:
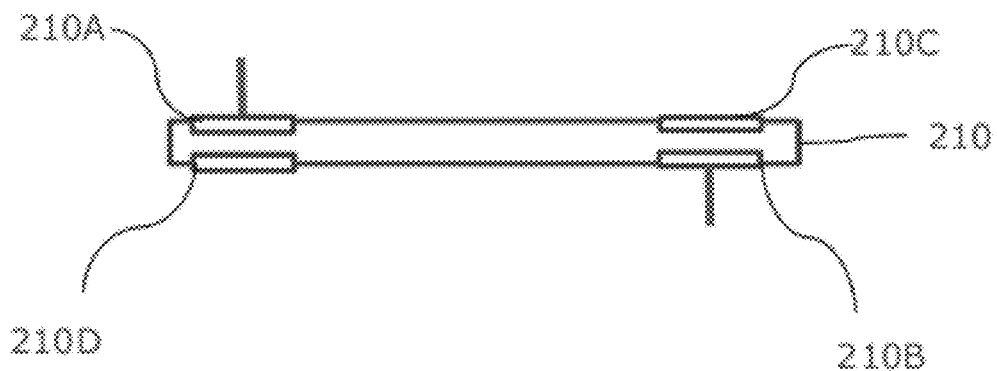
FIG. 4A illustrates an exemplary apparatus for circuit emulation consistent with the disclosed embodiments.

FIG. 4A illustrates an exemplary apparatus for circuit emulation consistent with the disclosed embodiments. Referring to FIG. 4A, the apparatus may include a first circuit board 210 and four interconnection interfaces 210A-210D. In one embodiment the interconnection interfaces may be male or female connectors that allow multiple circuit boards to stack over each other. In some embodiments, first interconnection interface 210A and second interconnection interface 210B may be male connectors, and third interconnection interface 210C and fourth interconnection interface 210D may be female connectors. With such exemplary configuration, lower connector 210D on the left side of circuit board 210 can be a female connector to accept the upper connector on the left side of a underlying board, which can be a male connector. Similarly, lower connector 210B on the right side of circuit board 210 can be a male connector to insert into the upper connector on the right side of the underlying board, which can be a female connector. Accordingly, the interconnection interface design allow a system to expand freely using the same board to stack vertically or in other manners of structural expansion, offering stackability, expandability, and/or flexibility in various applications.

In some embodiments, interconnection interfaces 210A-210D may each offer multiple conductive paths or one or more communication channels that may be entirely independent or partially independent from those of other interconnection interfaces. In other words, interconnection interfaces 210A-210D each may provide a communication interface without having to share the same communication bus (and as a result, the same limited bandwidth). However, in some other embodiments, a system designer is free to configure interconnection interfaces 210A-210D so that they (or part of them) share the same communication bus. While FIG. 4A illustrates an exemplary circuit board having four interconnection interfaces 210A-210D, the number of interconnection interfaces may vary depending on factors such as emulation needs, system designs, cost, applications, etc. For example, a circuit board with as little as two interconnection interfaces may offer similar stackability, expandability, and/or flexibility.

Figure 4B:
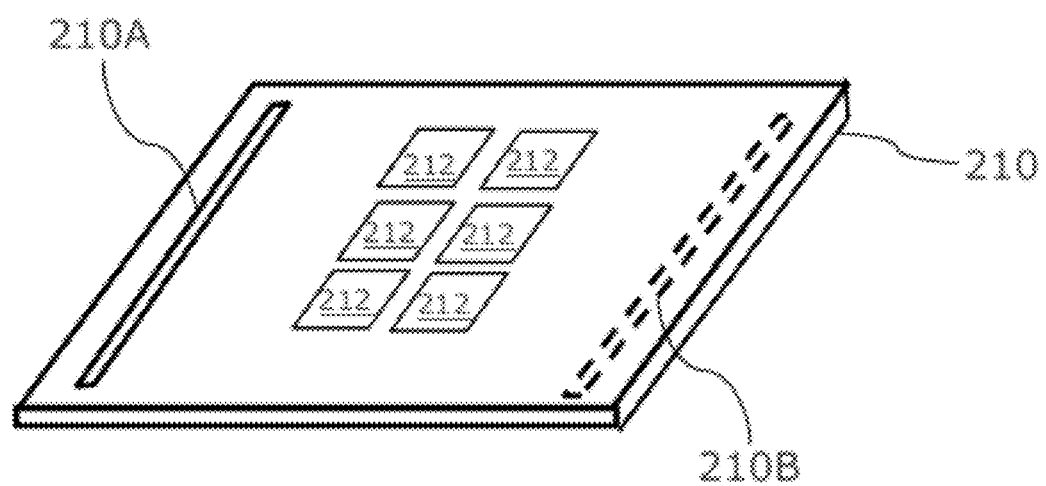
FIG. 4B illustrates an exemplary apparatus for circuit emulation with two interconnection interfaces and consistent with the disclosed embodiments.

FIG. 4B illustrates an exemplary apparatus for circuit emulation with two interconnection interfaces and consistent with the disclosed embodiments. Referring to FIG. 4B, circuit board 210 may have first interconnection interface 210A and second interconnection interface 210B on circuit board 210. In one embodiment, first circuit board 210 may provide conductive wiring paths for coupling the devices on the circuit board or for external couplings with the circuit board. As an example, as shown in FIG. 4B, one or more circuit emulation resources 212 may be placed on first circuit board 210 and coupled with a portion of the conductive wiring paths. Each circuit emulation resource may be configured to emulate a portion of an electronic circuit by receiving input signals and producing output signals in response to the input signals. In some embodiments, an emulation resource may include one or more programmable logic devices (PLDs) or programmable gate arrays (PGAs), field-programmable gate arrays (FPGAs), random access or read only memories (RAMs or ROMs), application-specific integrated circuits (ASICs), microprocessors, etc. As an example each PLD or FPGA may have terminals for receiving its input signals and transmitting its output signals. The conductive wiring paths of first circuit board 210 may be configured to link a portion of the terminals between programmable logic devices.

In some embodiments, first interconnection interface 210A may be placed on one side (such as the upper side) of first circuit board 210 and coupled with a portion of circuit emulation resources 212. First interconnection interface 210A may be configured to couple with an interconnection interface of a second circuit board, which may be placed above first circuit board 210 and may provide a group of conductive wiring paths and have a group of circuit emulation resources placed on the second circuit board. Second interconnection interface 210B may be placed on another side (such as the lower side) of first circuit board 210 and coupled with a portion of the circuit emulation resources. The portion of the circuit emulation resources coupled with second interconnection interface 210B may be the same, different, or partially overlapped with the portion of the circuit emulation resources coupled with first interconnection interface 210A. Second interconnection interface 210B may be configured to couple with an interconnection interface of a third circuit board, which may be placed below first circuit board 210 and may provide a group of conductive wiring paths and have a group of circuit emulation resources placed on the third circuit board.

Figure 4C:
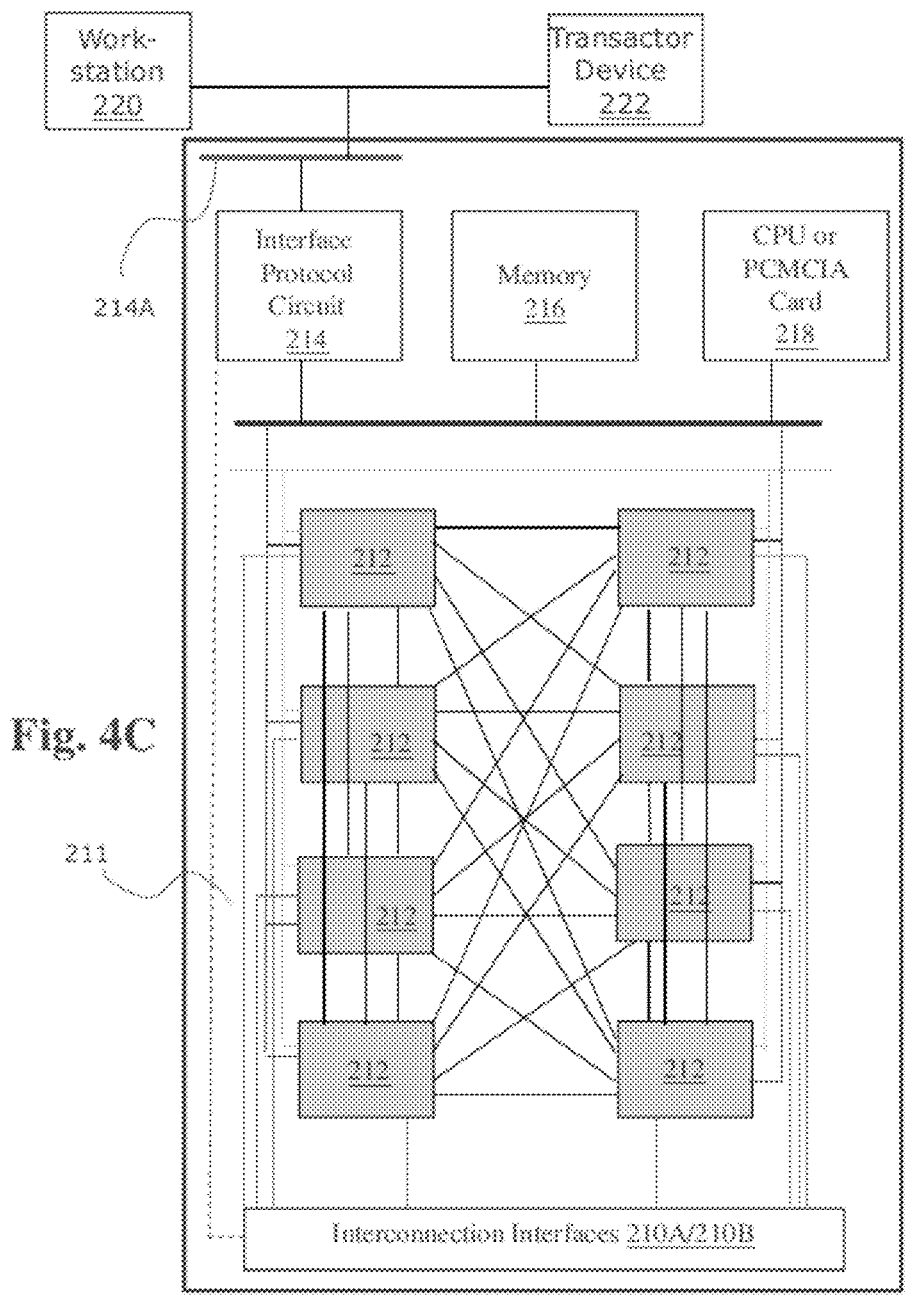
FIG. 4C illustrates an example of components and connections on a circuit board consistent with the disclosed embodiments.

FIG. 4C illustrates an example of components and connections on a circuit board consistent with the disclosed embodiments. Referring to FIG. 4C, first circuit board 210 may have conductive wiring paths 211 for coupling with the devices on the circuit board or with other devices that may be external to but coupled with the circuit board. The conductive wiring paths may be formed on one or both sides of first circuit board 210. In one embodiment, one or more wiring layers may be formed within the circuit board to provide the additional conductive wiring paths needed. Various types of circuit emulation resources 212 may be placed on first circuit board 210, such as PLDs, PGAs, FPGAs, RAMs or ROMs, ASICs, microprocessors, etc. Depending on the circuits to be emulated, various types of circuit devices or components can serve as circuit emulation resources 212 to emulate the behavior of any portion of a circuit or IC DUT. Examples of FPGAs may include those supplied by Xilinx, Inc. of San Jose, Calif., such as its Virtex series of products, or Altera Corporation of San Jose, Calif., such as its Stratix series of products, which may have more than 1000 I/O (input/output) pins and more than 400,000 gates.

First circuit board 210 may also include additional components, some of which may be optional components depending on different emulation needs. In some embodiments, those additional components may include interface protocol circuit 214, memory 216, and central processing unit ("CPU") or PCMCIA card 218, and additional active or passive components and circuits may be included depending on various emulation needs. First circuit board 210 may also have communication interface 214A, which may provide one or more input/output terminals for coupling with and communications with external devices. Those optional components will be described later in various embodiments. Although interconnection interfaces 210A and 210B illustrated in FIG. 4C are placed at the lower edge of first circuit board 210, they may be placed like the example illustrated in FIG. 4A or 4B or placed at other places for ease of stackability and expandability.

In some embodiments, an emulation system may be configured to emulate an IC within its intended operating environment and may be installed on or coupled with additional external circuit board(s) or component(s) that operate with the IC. Depending on the goals of emulations or the designs of various ICs, first circuit board 210 may include or be coupled with many other additional circuits or components, and one skilled in the art may vary the system components or circuits without deviating from the invention illustrated by disclosed embodiments.

Referring to FIG. 4C, first circuit board 210 may be coupled with workstation 220, such as through communication interface 214A. Communication interface 214A may provide an appropriate connection interface depending on the system design. For example, it may provide a communication bus, which may receive or transmit (or both receive and transmit) signals via various types of communication mediums, such as fiber optics (with the air or space within as the medium), conductive contacts, cable connectors, cables, IEEE (Institute of Electrical and Electronics Engineers) 1394 interface, PCI-e interface, other serial interfaces, parallel interfaces, etc. Workstation 220 may be coupled with one or more emulation resources 212 directly or indirectly for providing programming signals to program emulation resources 212. In one embodiment, workstation 220 may communicate with first circuit board 210 or other components via one or more serial or parallel ports or bus interfaces. Depending on the communication protocols and signals, one or more intermediate circuits, such as interface protocol circuit 214, may be coupled between workstation 220 and emulation resources 212. Interface protocol circuit 214 may include a clock and control circuit in some embodiments for providing one or more clock signals and/or control signals to other components on first circuit board 210, such as emulation resources 212, memory 216, and/or CPU or PCMCIA card 218. In some embodiments, workstation 220 may program the circuits, components, and/or emulation resources on circuit board 210 and may supply input signals to portions of the circuit being emulated by circuit board 210.

Referring to FIG. 4C, memory 216 may store data for or result from the emulation and may store data that may control or data for generating emulation signals during the emulation process, such as signal patterns generated during the emulation. Memory 216 may use one or more of various type of storage devices, such as DRAM (dynamic random access memory), SDRAM (synchronous DRAM), DDR (double data rate synchronous DRAM), SRAM (static random access memory), flash memory, and a magnetic or optical storage device. In one embodiment, workstation 220 may load the pattern-control data into memory 216 prior to the start of the emulation. Workstation 220, interface protocol circuit 214, memory 216, or its combinations may serve as a data acquisition device that may monitor the output signals from emulation resources and store the data (or probe data) in memory 216. Alternatively, an additional data acquisition circuit may serve as a data acquisition device that may monitor the output signals from emulation resources and store the data (or probe data) in memory 216.

Referring to FIG. 4C, first circuit board 210 may also be coupled with transactor device 222, also through communication interface 214A. In one embodiment, transactor device 222 may be an external device that provides a connection interface to an emulation system or first circuit board 210. The transactor device allows the system to communicate with workstation 220 or external components based on a protocol, rather than unconverted signals that are carried by separate and physical wires. The signals communicated may remain unchanged or similar, but the converted form(s) or representation(s) of signals under one or more communication protocols may increase the bandwidth of the signal communication through transactor device 222 and communication interface 214A. In some embodiments, it may also reduce signal interference or distortion caused by the physical constraints of the wires or other communication mediums. Interface protocol circuit 214, which will be illustrated below, may also serve the function of a transactor device, and one or more of the various protocols illustrated below may be used. In one embodiment, the protocol may be one developed by Fortelink, Inc. in Fremont, Calif. (now a subsidiary of Springsoft, Inc. in San Jose, Calif.), making it a Fortelink Transactor Device (FTD). As an exemplary embodiment, an external storage device, such as a an external hard disk or magnetic, solid-state, or optical storage device may be connected to the emulation system or first circuit board 210 through a fiber optic channel (as communication interface 214A) that carries data under the SATA (Serial Advanced Technology Attachment) protocol.

Figure 5:
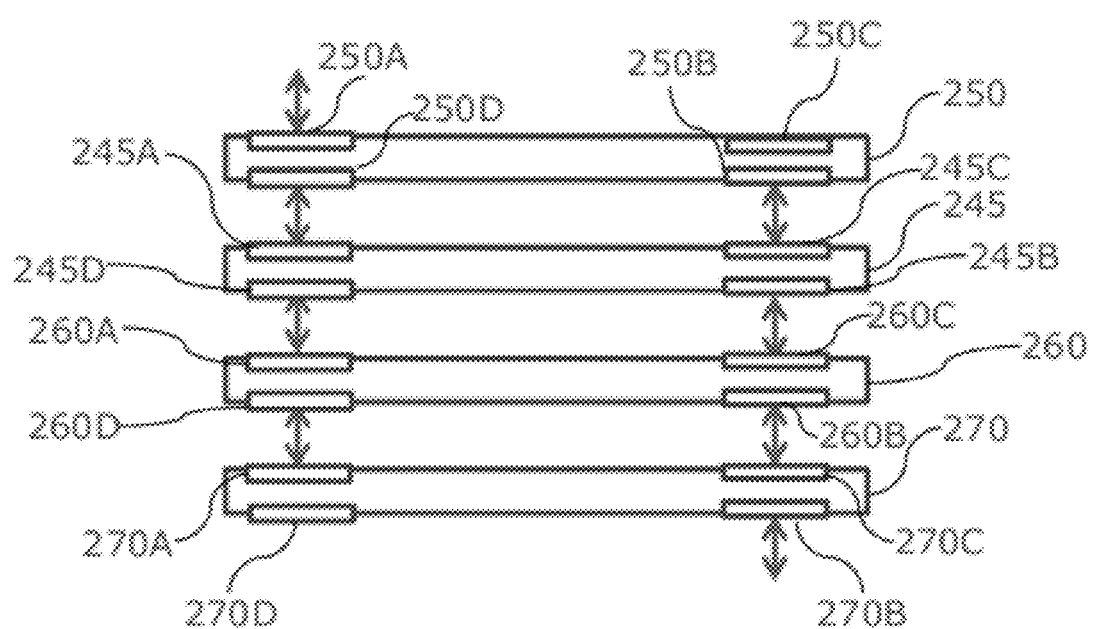
FIG. 5 illustrates an exemplary side view to show a vertical stacking of multiple circuit boards consistent with the disclosed embodiments.

FIG. 5 illustrates an exemplary side view to show a vertical stacking of multiple circuit boards 245, 250, 260, and 270. In one embodiment, the configuration of each board may be similar to the circuit board illustrated in FIG. 4 and have four interconnection interfaces. Also, the placement of male or female connectors may be made at standardized locations to offer stackability of multiple circuit boards sharing the same design or similar designs for the interconnection interfaces and their locations. One or more of the interconnection interfaces, such as interconnection interfaces 245A-245D, may be a communication bus, which may receive or transmit (or both receive and transmit) signals via various types of communication mediums, such as fiber optics (with the air or space within as the medium), conductive contacts, cable connectors, cables, IEEE (Institute of Electrical and Electronics Engineers) 1394 interface, other serial interfaces, parallel interfaces, etc. In one embodiment, one or more of interconnection interfaces 245A-245D may be independent from others. In other words, they may provide communication interfaces for completely different or independent signals. However, depending on the circuit(s) being emulated, they may provide communication interface for the same signals (or conductive wires or communication channels), partially-overlapped signals, or entirely independent signals.

Referring to FIG. 5, circuit board 245 may have four interconnection interfaces 245A-245D; and circuit board 250 may have four interconnection interfaces 250A-250D. Similarly, circuit board 260 may have four interconnection interfaces 260A-260D; and circuit board 270 may have four interconnection interfaces 270A-270D. In one embodiment, there may be two pairs of interconnection interfaces that may interconnect between to neighboring boards, such as 245A-250D and 245C-250B pairs between circuit board 245 and circuit board 250, 245D-260A and 245B-260C pairs between circuit board 245 and circuit board 260, and 260D-270A and 260B-270C pairs between circuit board 260 and circuit board 270, Skilled in the art may vary the number of interconnection interfaces as well as the number of other intra-board structures, depending on factors such as the need, design, and application of emulation systems. Also, different boards within the same emulation system may have the same or different numbers of interconnection interfaces.

Figure 6A:
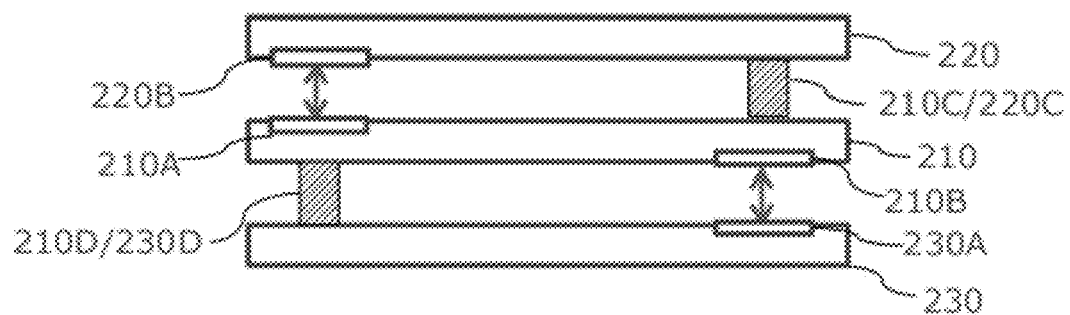
FIG. 6A illustrates an exemplary system for circuit emulation with two or less interconnection interfaces for each circuit board and consistent with the disclosed embodiments.

While FIG. 5 illustrates exemplary circuit boards having four interconnection interfaces for each board, the number of interconnection interfaces may vary depending on factors such as emulation needs, system designs, cost, applications, etc. For example, a circuit board with as little as two interconnection interfaces may offer similar stackability, expandability, and/or flexibility. FIG. 6A illustrates an exemplary system for circuit emulation with two or less interconnection interfaces for each circuit board and consistent with the disclosed embodiments. Referring to FIG. 6A, first circuit board 210 may include first interconnection interface 210A, which may be coupled with first interconnection interface 220B of second circuit board 220. First circuit board 210 may include second interconnection interface 210B, which may be coupled with first interconnection interface 230A of third circuit board 230. As shown in FIG. 6A, in one embodiment, interconnections between adjacent circuit boards are made at differing ends of the circuit boards, such that signals are routed through the circuit boards in a "zigzag" fashion. It should be noted that FIG. 6A serves merely as an exemplary illustration for showing how signal communications can be made through the interconnection interfaces of various boards in one embodiment, and the signal flows of actual emulation systems may vary for different designs and systems.

In many embodiments, the boards may have interconnection interfaces or other signal or mechanical couplings that provide mechanical support at more than one ends or areas of the circuit boards. For example, referring to FIG. 6A, inter-board structure(s) 210C/220C and 210D/230D, such as mechanical pins or other structures, may be optionally included in some embodiments to provide mechanical support for allowing multiple circuit boards to be stacked vertically and firmly. In some embodiments, dozens of or more circuit boards may be stacked vertically with signal communication ability and mechanical stability. As an example, intra-board structure(s) 210C/220C and 210D/230D may be primarily mechanical structures, such as pins, screws, clamps, latches, pillars, etc. in some embodiments. In some other embodiments, Intra-board structure(s) 210C/220C and 210D/230D may be additional interconnection interfaces that provide intra-board signal communication or both intra-board signal communication and mechanical support. In other words, rather than providing one interconnection interface at one end of the board as illustrated in FIG. 4C, additional interconnection interfaces or supporting structures may be optionally placed on a circuit board to provide additional signal communication interfaces, mechanical support, or both. In one embodiment, the upper interconnection interface of each circuit board may be a male connector, and the lower interconnection interface of each circuit board may be a female connector. As a result, boards of the same design may be vertically stacked without the need to create multiple board designs for stackability.

Figure 6B:
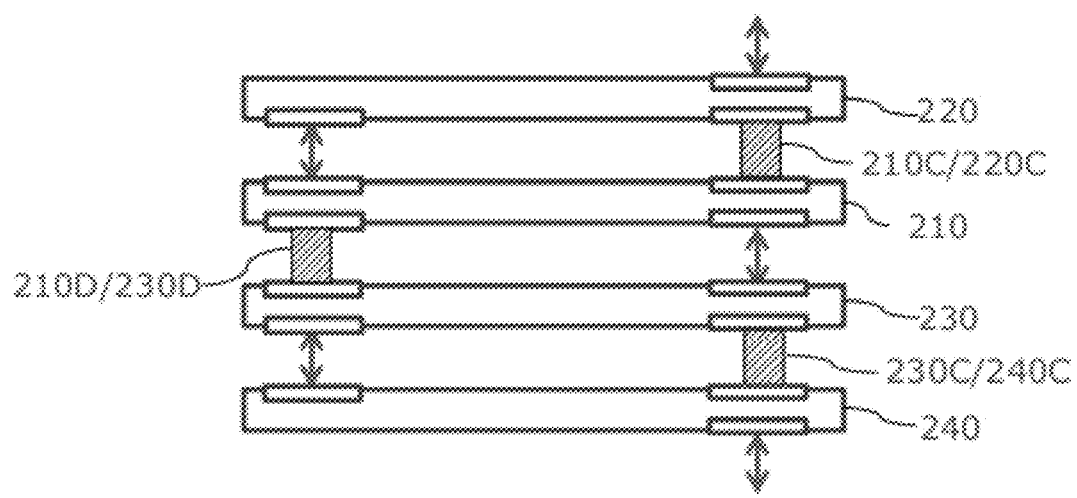
FIG. 6B illustrates an exemplary side view to show a vertical stacking of multiple circuit boards consistent with the disclosed embodiments.

FIG. 6B illustrates an exemplary side view to show a vertical stacking of multiple circuit boards, such as first circuit board 210, second circuit board 220, third circuit board 230, and fourth board 240. In one embodiment, each of first circuit board 210, second circuit board 220, third circuit board 230, and fourth board 240 may have two or more interconnection interfaces (one below and one above) that may be configured to communicate different, partially-overlapped, or the same signals. The illustrated example provides an example of a "zigzag" architecture that may be implemented, which may increase the number of independent signaling channels between the different circuit boards and increase the expandability, capacity, and scalability of the emulation system. The ability of each interconnection interface to communicate independently from other interconnection interfaces increases the number of signals being communicated among various board. Similar to FIG. 6A, additional inter-board structure(s) 210C/220C, 210D/230D, 230C/240C may be optionally added to provide mechanical support, to provide additional interconnection interfaces, or to provide both.

In some embodiments, a circuit emulation apparatus may employ a mix of hardware and software-based emulation resources to emulate portions of a DUT a test bench describes, to generate test signal inputs to the emulated DUT, and to acquire data representing the behavior of the response signals appearing at the probe points of the emulated DUT. The apparatus may process the test bench to determine which of its emulation resources to employ to emulate each portion of the DUT, to determine which resources will generate the test signals and which resources will monitor the emulated DUT's output signals. The apparatus may then programs one or more emulation resources to carry out it assigned function.

U.S. Pat. No. 7,072,825 issued to Ming Yang Wang et al., entitled "Hierarchical, Network-Based Emulation System" relates to and describes how emulation resources may communicate with one another and with a workstation that may program the emulation resources. The entirety of the disclosure is incorporated herein by reference. In one embodiment, the communication of each signal need not rely on hard-wired signal paths and may rely on virtual signal paths implemented by interface-protocol or transaction devices mounted on circuit boards. As an example, transaction devices may transmit data in packet or other forms, such as transmitting data packets to one another via a packet routing network. The transaction devices may encode signals into data packets and decode signals from data packets. The signals being encoded may come from certain resources on a circuit board through hard-wired signal paths, and the decoded signals may be transmitted to certain resources on a circuit board through hard-wired signal paths.

Therefore, although interconnection interfaces 210A and 210B of first circuit board 210 may offer signal communications by conductive signal paths, it may also provide signal communications through a converted form of signal representations, such as in a compressed or converted format based on certain protocols, in a time- or/and frequency-divided form, or in a packet form. The alternative forms of signal representations allow the same communication medium or channel to offer an increased number of signals that may be communicated through the interconnection interfaces at the same time without the need to significantly expand the type or scale of the interconnection interfaces.

Referring back to FIG. 4C as an example, interface protocol circuit 214 may be coupled with or placed on first circuit board 210 to receive and process all or part of the input signals to and output signals from the components on first circuit board 210. The interface protocol circuit 214 may be a signal compression/decompression circuit, signal coding/decoding circuit, a network interface, a time-division encoder/decoder, a frequency-division encoder/decoder, or any other devices that communicate the input/output signals under a protocol that is also used by other boards. As an example, a network interface circuit may serve as interface protocol circuit 214 on the circuit board and be coupled with one or more circuit emulation resources 212. In various embodiments, emulation resources 212 may have signal communications with interconnection interfaces 210A or 210B directly via conductive signal paths or indirectly via an intermediate signal switching or conversion device, such as by using interface protocol circuit 214 as an intermediate device and communicating through the dashed line representing an alternative signal route.

When a network interface circuit is used as interface protocol circuit 214, it may be configured to receive some or all of the input signals and transmitting some or all of the output signals in a packet form via a communication network, which may be formed among multiple interconnection interfaces and among one or more circuit boards (such as circuit board 210) and workstation 220. Consistent with the descriptions in U.S. Pat. No. 7,072,825, a network interface circuit may also serve as a communication interface between a work station and one or more circuit boards.

Based on the descriptions in U.S. Pat. No. 7,072,825, a workstation or any transaction device may assemble and send a packet outward via a packet routing network. The packet routing network may forward the outgoing packet to a workstation and to resource boards or circuit boards, which may have a network interface or a transaction device to receive and handle network packets. In one embodiment, the network may selectively forward the packets based on their network destination addresses included in the packet. Each packet may be arranged or formatted in accordance with the particular physical layer protocol the network uses, but each packet will typically include in addition to payload data, a header containing information the network needs to route the packet. As an example, workstation 220, interface protocol circuit 214 (or a transaction device or network interface), and/or one or more of emulation resources 212 illustrated in FIG. 4C may each have a unique network address, and the header included in each data packet transmitted via packet routing network may indicate the network addresses of the devices designated as the source and destination of the packet. The header may include a command or data providing information about the action(s) to be carried out. The payload data a packet conveys may be of fixed or variable length depending on the nature of the network's physical layer protocol. The payload data may also include any data to be used (such as input signals) for carrying out the indicated actions. Examples of commands and data are further illustrated in U.S. Pat. No. 7,072,825.

Figure 7:
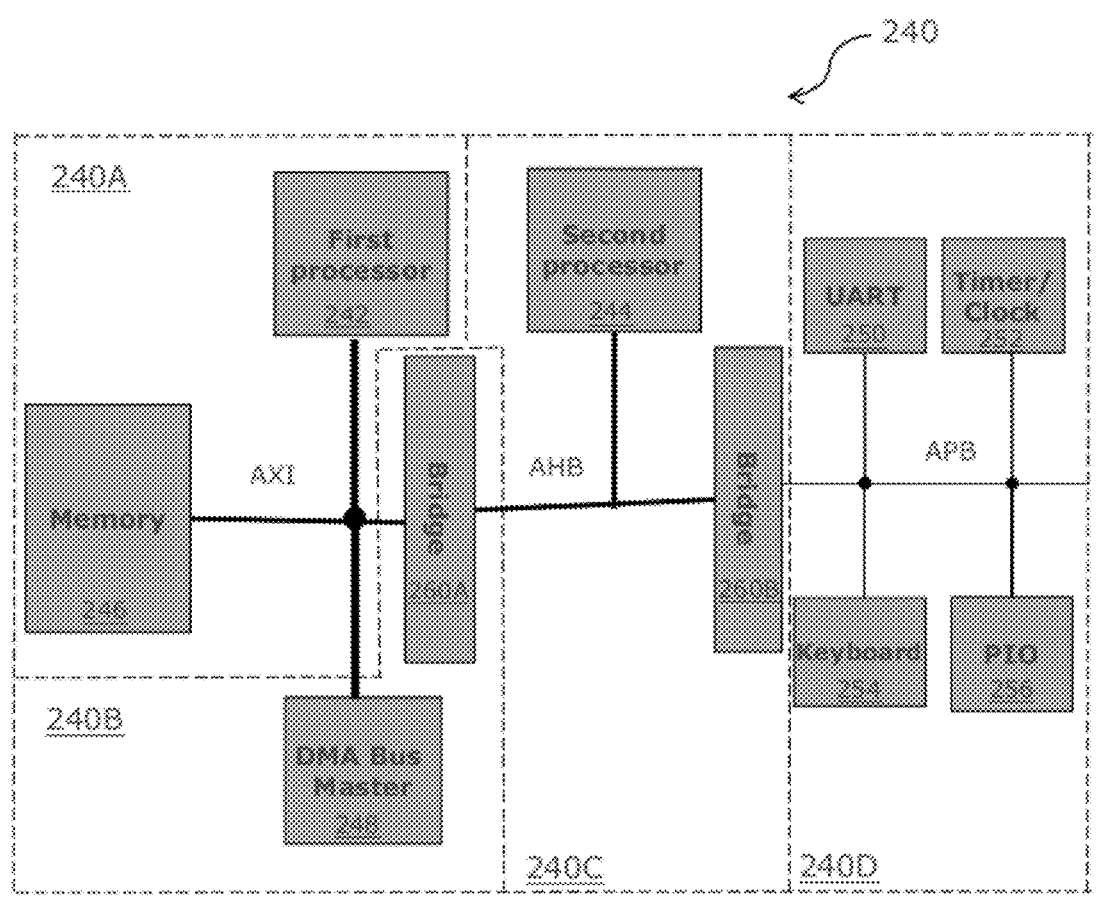
FIG. 7 illustrates an example of a circuit to be emulated consistent with the disclosed embodiments.

FIG. 7 illustrates an example of a circuit to be emulated consistent with the disclosed embodiments. Referring to FIG. 7, circuit 240 may include various components or devices. In one embodiment, circuit 240 may include first processor 242, second processor 244, memory 246, direct-memory-access ("DMA") bus master 248, receiver-transmitter 250 (such as a universal asynchronous receiver/transmitter (UART)), timer or clock device 252, keyboard 254, and input-output device 256 (such as a programmer input/output or parallel input/output (PIO)). In some embodiments, not all of the components of circuit 240 can fit on one circuit board of an emulation system, and the various components may be associated with multiple circuit boards. There may be various considerations for determining which components are placed on which boards. Those considerations may include, for example, the type of the components, the function of the components, the complexity of the components, the communication protocols or signal inputs/outputs of the components, the amount of inter-board communications, etc.

In one embodiment, the components illustrated in FIG. 7 may use a common communication protocol, such as the AMBA® protocol provided by ARM Limited of Cambridge, United Kingdom. The AMBA® protocol is an open standard and on-chip bus specification that defines the interconnection and management of functional blocks of a system. Under the AMBA® protocol, there may be various sub-protocols, such as AXI, AHB, and APB, which may provide signaling or communication mechanisms for different components. Referring to FIG. 7, first processor 242, memory 246, DMA bus master 248, and first bridge 260A may communicate with each other using the AXI protocol; second processor 244, first bridge 260A, and second bridge 260B may communicate with each other using the AHB protocol; and UART 250, timer or clock 252, keyboard 254, PIO 256, and second bridge 260B may communicate with each other using the APB protocol.

Figure 8:
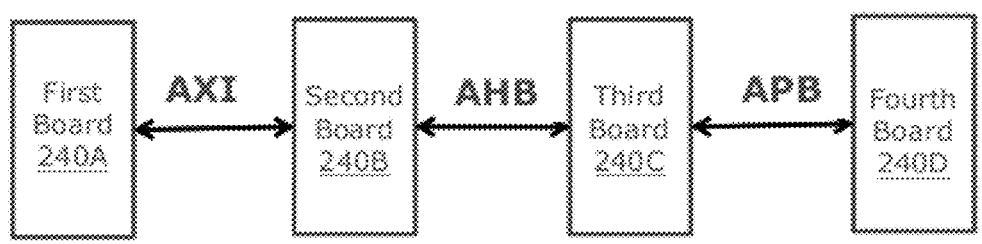
FIG. 8 illustrates a diagram representing a simplified circuit board representation of an emulation system that may emulate the circuit shown in FIG. 7.

In one embodiment, the various blocks or circuits may be divided into several circuit boards based on the sub-protocols they use. For example, first processor 242 and memory 246 may be placed on first circuit board 240A; DMA bus master 248 and first bridge 260A may be placed on second circuit board 240B; second processor 244 and second bridge 260B may be placed on third circuit board 240C; and UART 250, timer or clock 252, keyboard 254, and PIO 256 may be placed on fourth circuit board 240D. As a result, first circuit board 240A and second circuit board 240B may communicate using an interconnection interface running the AXI protocol. Second circuit board 240B and third circuit board 240C may communicate using the AHB protocol. Third circuit board 240C and fourth circuit board 240B may communicate using the APB protocol. FIG. 8 illustrates a diagram representing a simplified circuit board representation of an emulation system that may emulate the circuit shown in FIG. 7. In other words, the communications between various pairs of two neighboring (or of two vertically-stacked boards) need not rely on the same sub-protocols and may use different sub-protocols. Further, although the different interconnection interfaces between the circuit boards may have some similar or overlapping signaling channels, they may be independent from each other and communicate different signals for different portions of circuit 240 represented by an emulation system.

Figure 9:
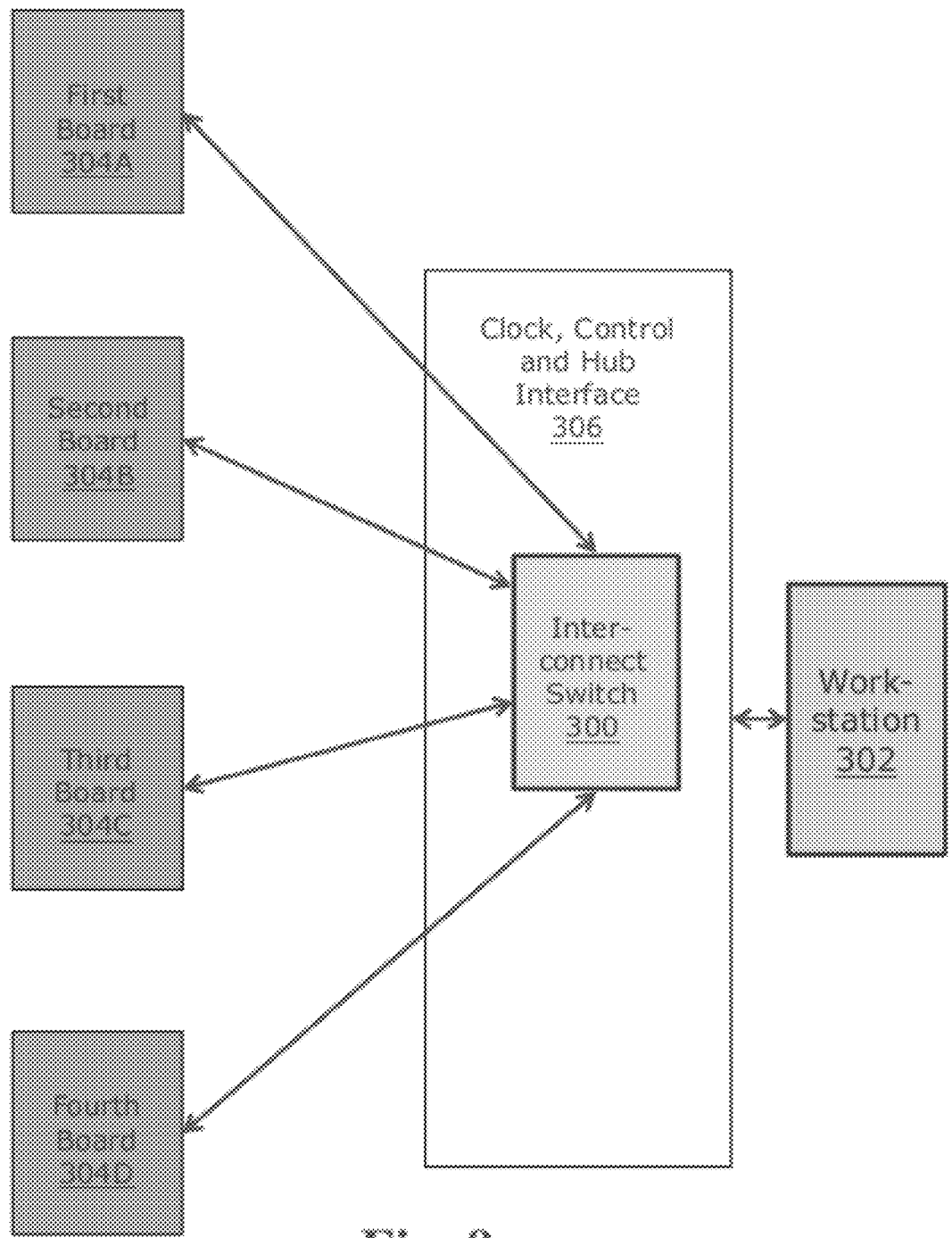
FIG. 9 illustrates an embodiment of an emulation system using a signal switching device consistent with the disclosed embodiments.

FIG. 9 illustrates an embodiment of an emulation system that may use a signal switching device, such as interconnect switch 300. Interconnect switch 300 may be coupled between workstation 302 and multiple circuit boards 304A-304D. In one embodiment, the Fortelink Interconnect Protocol ("FLIP") protocol developed by Fortelink, Inc. in Fremont, Calif. (now a subsidiary of Springsoft, Inc. in San Jose, Calif.)

may be used. In other embodiments, other interconnection protocols may be used. In one embodiment, interconnect switch 300 may route signals to and from circuit boards 304A-304D and may route the same, overlapping, or entirely different signals for different circuit boards 304A-304D. The communications between Interconnect switch 300 and circuit boards 304A-304D may rely on one or more of various types of communication mediums, such as fiber optics (with the air or space within as the medium), conductive contacts, cable connectors, cables, etc. In some examples, the circuit boards 304A-304D may rely on interconnection interfaces for communications between the circuit boards and may rely on a shared or non-shared bus or channel for communicating with workstation 302. In some examples, a common fiber optic channel may be shared by circuit boards 304A-304D with a protocol, such as a packet-switch protocol, to route signals directed to or output from the various boards. The interconnection interfaces among the circuit boards 304A-304D may rely on the interconnection interfaces discussed above. Therefore, the interconnection interfaces may be conductive contacts, cable connectors, or some other types of signal-communication interfaces.

In some examples, interconnect switch 300 and one or more of circuit boards 304A-304D may communicate using direct signaling paths or rely on certain communication protocols, including the various protocols illustrated above. In one example, the FLIP protocol may be used. In other words, a system may use the FLIP protocol (or other interconnection protocols) for all of its communications between the workstation and various circuit boards using a FLIP-protocol-based interconnect switch. In some embodiments, interconnect switch 300 may also be part of clock, control, and hub interface 306 coupled between workstation 302 and multiple circuit boards 304A-304D.

Figure 9A:
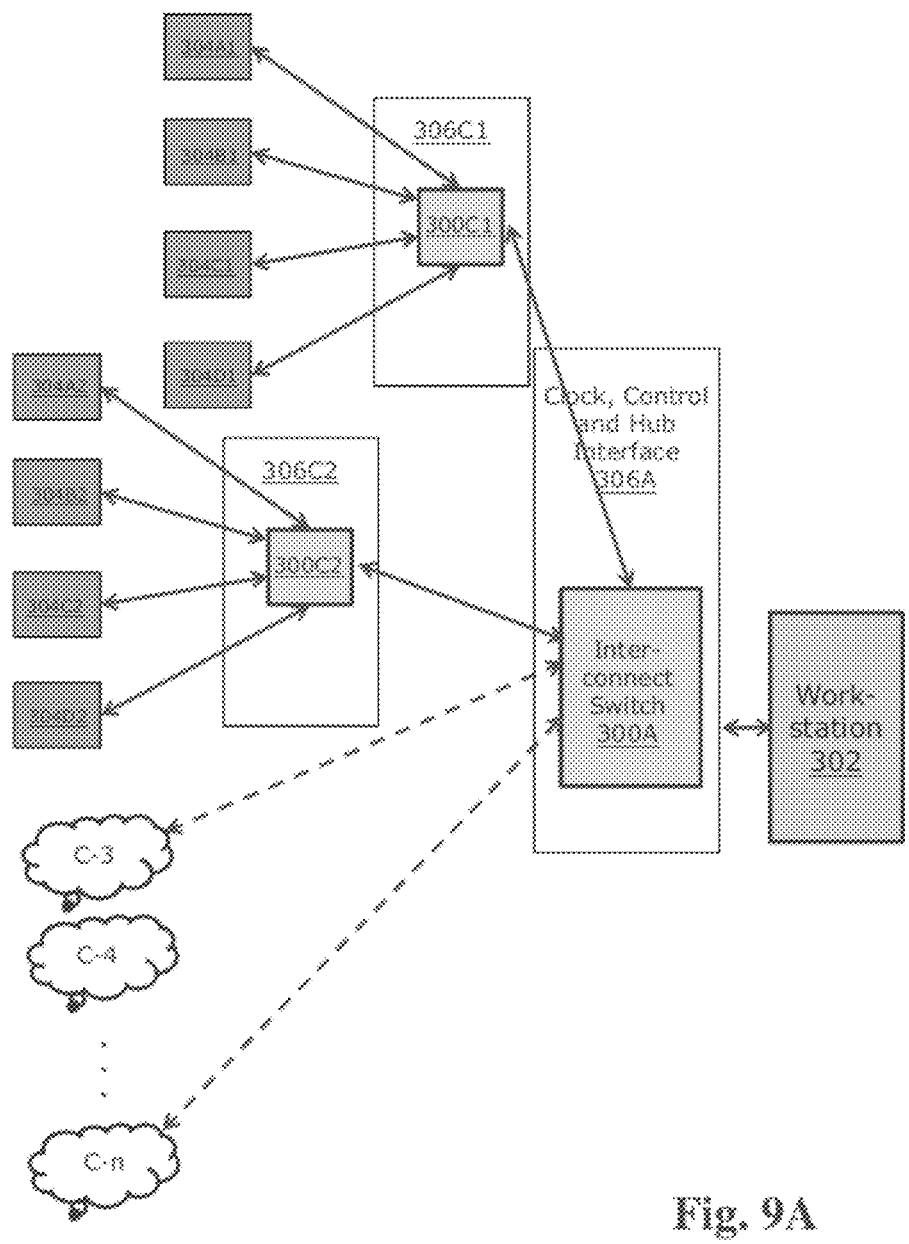
FIG. 9A illustrates an embodiment of an emulation system having a cluster-based architecture.

In some embodiments, the system may offer significant scalability and flexibility by providing a hierarchical or cluster-based architecture. FIG. 9A illustrates an example of a cluster-based architecture, in which each interconnect switch coupled with one or more circuit boards may form a "cluster." Referring to FIG. 9A, interconnect switch 300A may be coupled between workstation 302 and multiple clusters. In one embodiment, the first cluster may have its own interconnect switch 300C1 to route signals to and from one or more circuit boards, such as circuit boards 304A1-304D1, and may route the same, overlapping, or entirely different signals for different circuit boards. Similarly, the communications between Interconnect switch 300C1 and circuit boards 304A-304D, as well as the communications between Interconnect switch 300C1 and interconnect switch 300A, may rely on one or more of various types of communication mediums, such as fiber optics (with the air or space within as the medium), conductive contacts, cable connectors, cables, etc. Similar to the system in FIG. 9, in some examples, a group of circuit boards (304A1-304D1, 304A2-304D2, etc.) may rely on interconnection interfaces for communications between the circuit boards and may rely on a shared or non-shared bus or channel for communicating with workstation 302 through one or more interconnect switches. In some examples, a common fiber optic channel may be shared by multiple circuit boards and one or more interconnect switches with a protocol, such as a packet-switch protocol, to route signals directed to or output from the various boards. The interconnection interfaces among a group of circuit boards, such as 304A1-304D1, may rely on the interconnection interfaces discussed above. Therefore, the interconnection interfaces may be conductive contacts, cable connectors, or some other types of signal-communication interfaces.

In some examples, interconnect switch 300C1 and one or more of circuit boards 304A1-304D1 (or interconnect switch 300A and one or more of the other interconnect switches, such as 300C1, 300C2, etc.) may communicate using direct signaling paths or rely on certain communication protocols, including the various protocols illustrated above. Similar to the configuration in FIG. 9, interconnect switch 300A may be part of clock, control, and hub interface 306A coupled between workstation 302 and multiple circuit boards 304A-304D in some embodiments. In the first cluster, interconnect switch 300C1 may also be part of clock, control, and hub interface 306C1 coupled between interconnect switch 300A and multiple circuit boards 304A-304D in some embodiments, In some embodiments, interconnect switch 300A may be called as a "central" interconnect switch or central signal switching device because of its proximity to workstation 302

Referring again to FIG. 9A, additional clusters, each having an interconnect switch coupled with one or more circuit boards, may be coupled with interconnect switch 300A. For example, the second cluster may have a configuration different from or similar to the first cluster, e.g. having its own interconnect switch 300C2 to route signals to and from one or more circuit boards, such as circuit boards 304A2-304D2, and may route the same, overlapping, or entirely different signals for different circuit boards. Additional clusters C-3, C-4, and C-n having configurations different from or the same as that of the first and second clusters may be added depending on the need of an emulation system.

The configuration, signaling mechanism, and scale of an emulation system may be varied based on the design and demand of emulation systems. For example, an interconnect switch may offer more than one form of signal communications, more than one communication protocols, and/or more than one medium of communication. In addition, although only one circuit board is shown in FIGS. 9 and 9A, each circuit board block may represent one or multiple boards (e.g. a group of several boards), some or all of which may be stacked over each other, and some or all of circuit boards may have different designs, use different forms of signal communications, use different communication protocols or data formats, and/or communicate with the corresponding interconnect switch via different mediums, such as fiber optics (with the air or space within as the medium), conductive contacts, cable connectors, cables, etc.

In many embodiments, the use of an interconnect switch may allow the routing of appropriate signals using a suitable format, protocol, and medium at an appropriate timing and may expand the system to have one or more layers of clusters such as the one-layer-of-cluster configuration in FIG. 9A. The scalability additional layer(s) of clusters may offer flexibility with the design, functions, and capability of an emulation system. For example, while one group of boards or one cluster may use a particular communication protocol, such as the FLIP protocol, through fiber optics, other groups of boards or other clusters or layers may rely on direct signal communication or use another protocol through a different interface medium, such as cable connectors.

Figure 10:
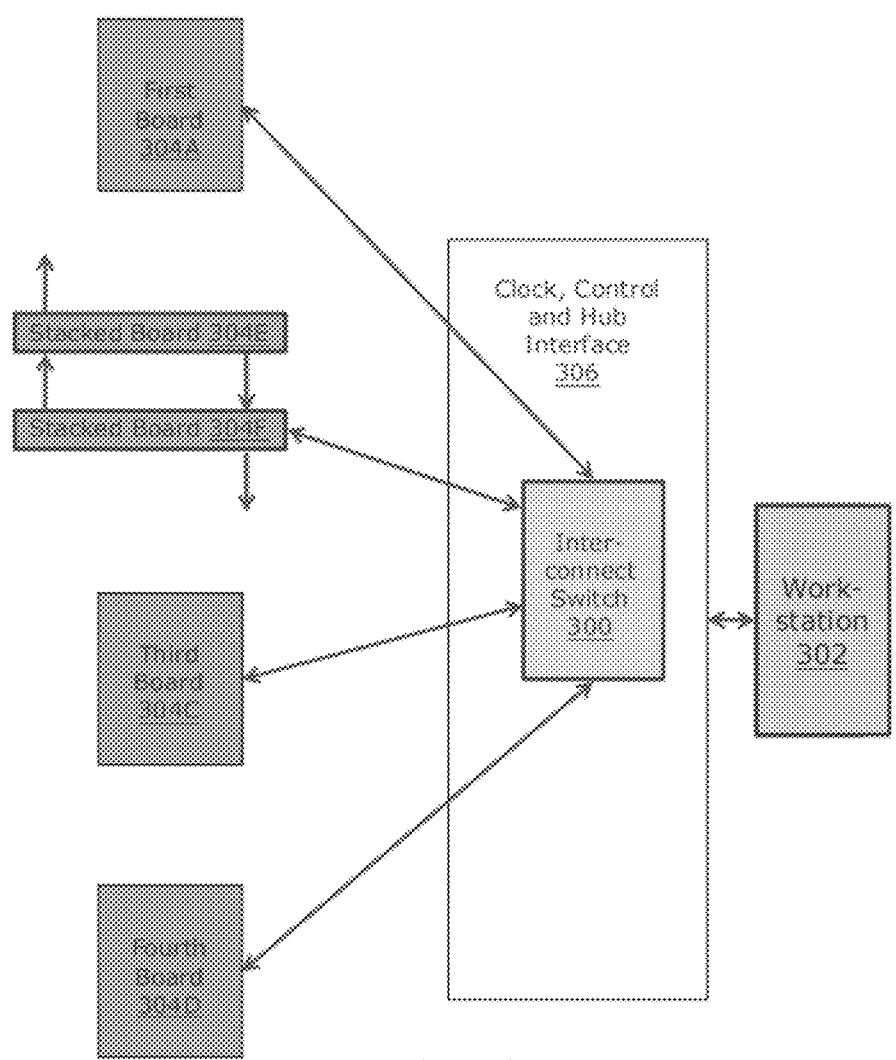
FIG. 10 illustrates another embodiment of an emulation system using a signal switching device consistent with the disclosed embodiments.

FIG. 10 illustrates another embodiment of an emulation system that may use a signal switching device, such as interconnect switch 300. In this embodiment, one or more of the circuit boards that interconnect switch 300 is coupled with may be a set of stacked boards, such as stacked boards 304E and 304F, and one or both of the boards may have two or more interconnection interfaces discussed above and illustrated in FIGS. 4A-4C. In other words, instead of having independent couplings to interconnect switch 300, two or more stacked boards may inter-communicate with each other through their interconnection interfaces and may share a common coupling or communication channel to interconnect switch 300. The various embodiments and implementations discussed regarding FIG. 9, including the use of the various communication mediums, protocols, etc. and the use of the FLIP protocol in some embodiments, may also be used with the system illustrated in FIG. 10.

Figure 11:
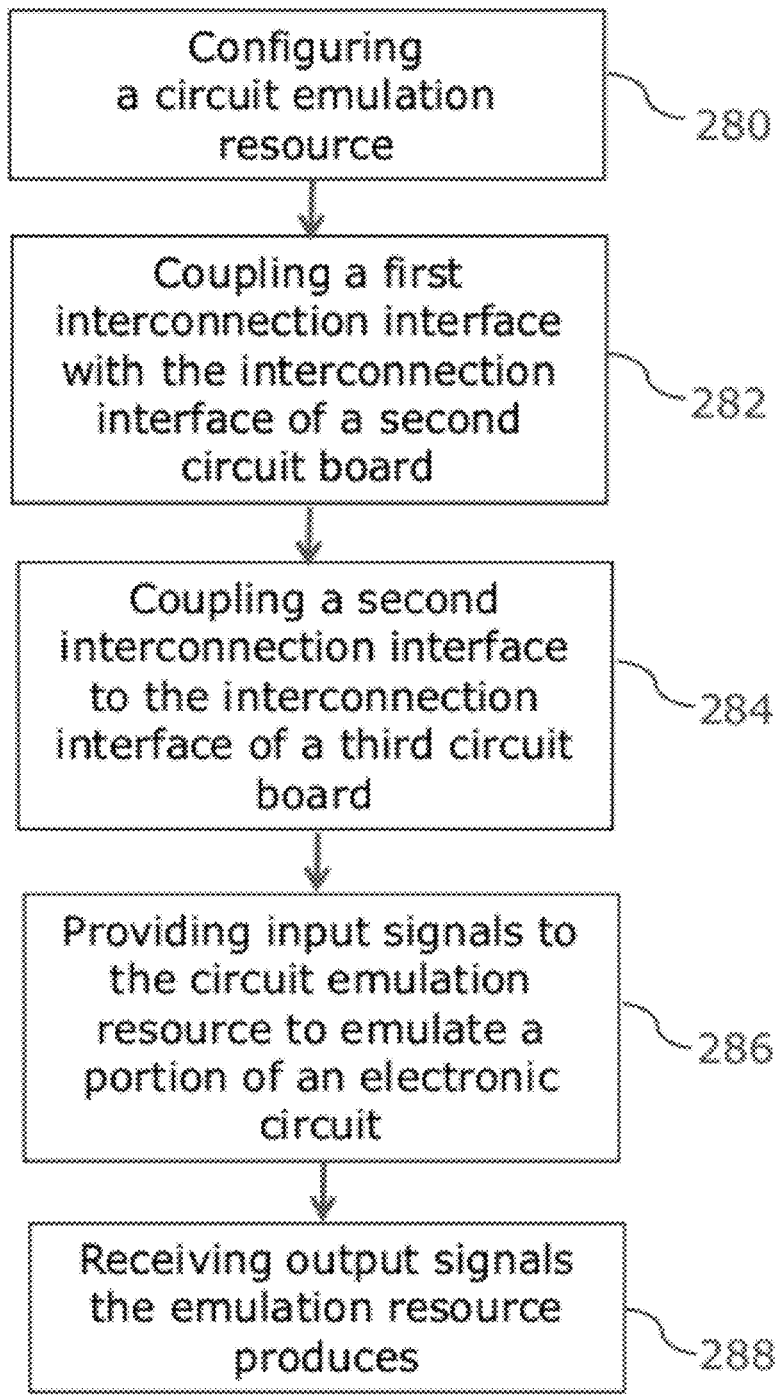
FIG. 11 is an exemplary flow chart for illustrating a method of performing a circuit emulation consistent with the disclosed embodiments.

FIG. 11 is an exemplary flow chart for illustrating a method of performing a circuit emulation. Referring to FIG. 11 and consistent with the embodiments disclosed above, circuit emulation may be performed by several steps, such as configuring at least one circuit emulation resource on the circuit board providing conductive wiring paths (step 280); coupling a first interconnection interface on the circuit board with an interconnection interface of a second circuit board (step 282); and coupling a second interconnection interface on the circuit board to an interconnection interface of a third circuit board (step 284). Circuit emulation may also be performed by the additional steps of: providing input signals to the at least one circuit emulation resource to emulate a portion of an electronic circuit (step 286); and receiving output signals the at least one circuit emulation resource produces in response to the input signals to perform circuit emulation (step 288).

In some embodiments and consistent with embodiments of emulation systems described above, the circuit emulation resource may be coupled with a portion of the conductive wiring paths, with each circuit emulation resource being configured to emulate a portion of an electronic circuit. The second circuit board may provide a second group of conductive wiring paths and have a second group of circuit emulation resources. The first interconnection interface may be coupled with at least a first portion of the at least one circuit emulation resource. Similarly, the third circuit board may provide a third group of conductive wiring paths and have a third group of circuit emulation resources. And the second interconnection interface may be coupled with at least a second portion of the at least one circuit emulation resource.

An emulation system may simplify the programming and or connection efforts needed to allow different kinds of emulation resources to interact with one another, because different boards may have interconnection interfaces that may be independent from each other and carry different signals. The use of an interface protocol circuit, such as interface protocol circuit 214 in FIG. 4C, may provide a signal compression/decompression circuit, signal coding/decoding circuit, a network interface, a time-division encoder/decoder, a frequency-division encoder/decoder, etc. that may increase the bandwidth (i.e. the number of signals) for communication. Multiple circuit boards may be stacked together or otherwise coupled together without being restricted to relying on one shared communication bus that provides limited number of signals paths. In some embodiments, multiple PLD, PGA, or FPGA boards may be interconnected and the scalability, complexity, capacity and/or connectivity of an emulation system may be scaled up easily. Further, interconnection protocols, including those discussed above (FLIP, AMBA, etc.) and illustrated in U.S. Pat. No. 7,072,825, may be implemented to further increase the scalability, complexity, capacity and/or connectivity of an emulation system.

Other embodiments consistent with the present disclosure will be apparent to those skilled in the art from consideration of the specification and practice of the embodiments disclosed herein. The exact constructions of the embodiments described above and illustrated in the accompanying drawings are not meant to be limiting, and various modifications and changes can be made without departing from the scope thereof. It is intended that the scope of the disclosed embodiments only be limited by the appended claims.

What is claimed is:

1. An apparatus for circuit emulation, the apparatus comprising:
   a first circuit board having conductive wiring paths;
   at least one circuit emulation resource on the first circuit board and coupled with a portion of the conductive wiring paths, each circuit emulation resource being configured to emulate a portion of an electronic circuit by receiving input signals and producing output signals in response to the input signals;
   a first interconnection interface on the first circuit board and coupled with at least a first portion of the at least one circuit emulation resource, the first interconnection interface being configured to couple with an interconnection interface of a second circuit board having a second group of conductive wiring paths and having a second group of circuit emulation resources; and
   a second interconnection interface on the first circuit board and coupled with at least a second portion of the at least one circuit emulation resource, the second interconnection interface being configured to couple with an interconnection interface of a third circuit board having a third group of conductive wiring paths and having a third group of circuit emulation resources,
   wherein the first interconnection interface and the second interconnection interface have at least one of non-overlapped signaling paths and provide at least a structural support for coupling the first, second, and third circuit boards and enabling structural stackability of the apparatus for circuit emulation.

2. The apparatus according to claim 1, wherein the first interconnection interface is on a first side of the first circuit board, the second interconnection interface is on a second side of the first circuit board, and the first interconnection interface communicates part of its signals independently from the second interconnection interface.

3. The apparatus according to claim 1, further comprising an interface protocol circuit coupled with the first circuit board, the interface protocol circuit receiving and processing at least a portion of the input signals.

4. The apparatus according to claim 1, further comprising a network interface circuit on the first circuit board and coupled with the at least one circuit emulation resource, the network interface circuit being configured for receiving at least a portion of the input signals and transmitting at least a portion of the output signals in a packet form via a communication network.

5. The apparatus according to claim 1, further comprising a work station coupled with the first circuit board and with the at least one circuit emulation resource for providing programming signals to program the at least one circuit emulation resource.

6. The apparatus according to claim 1, further comprising a signal switching device coupled with the first circuit board, the second circuit board, and the third circuit board for routing signals to and from the first circuit board, the second circuit board, and the third circuit board.

7. The apparatus according to claim 1, further comprising a central signal switching device coupled with at least two clusters, wherein a first cluster comprises the signal switching device, the first circuit board, the second circuit board, and the third circuit board, and a second cluster comprises a second signal switching device coupled with a second group of circuit boards.

8. The apparatus according to claim 1, further comprising a clock circuit and a control circuit coupled with the first circuit board and coupled with the at least one circuit emulation resource.

9. The apparatus according to claim 1, further comprising a memory device on the first circuit board and coupled with the at least one circuit emulation resource, the memory device being configured as a data storage device of the at least one circuit emulation resource.

10. The apparatus according to claim 1, wherein the at least one circuit emulation resource comprises a plurality of programmable logic devices each having terminals for receiving its input signals and transmitting its output signals, and wherein the conductive wiring paths of the first circuit board are configured to link a portion of the terminals between the plurality of programmable logic devices.

11. The apparatus according to claim 10, wherein the plurality of programmable logic devices comprise field-programmable gate arrays.

12. The apparatus according to claim 1, wherein at least one of the first interconnection interface and the second interconnection interface comprises a communication bus receiving and transmitting signals via at least one of fiber optics, conductive contacts, and cable connectors.

13. A method for performing circuit emulation on a computer system comprising a processor and a memory encoded with program instructions that, when executed by the processor, cause the system to perform the method, the method comprising:

configuring, by the processor, at least one circuit emulation resource on a first circuit board having a first group of conductive wiring paths, the circuit emulation resource being coupled with a portion of the conductive wiring paths of the first group of conductive wiring paths, each circuit emulation resource being configured to emulate a portion of an electronic circuit;

coupling a first interconnection interface on the first circuit board with an interconnection interface of a second circuit board having a second group of conductive wiring paths and having a second group of circuit emulation resources, wherein the first interconnection interface is coupled with at least a first portion of the at least one circuit emulation resource;

coupling a second interconnection interface on the first circuit board to an interconnection interface of a third circuit board having a third group of conductive wiring paths and having a third group of circuit emulation resources, wherein the second interconnection interface is coupled with at least a second portion of the at least one circuit emulation resource, wherein the first interconnection interface and the second interconnection interface have at least one of non-overlapped signaling paths and provide at least a structural support for coupling the first, second, and third circuit boards and enabling structural stackability of the apparatus for circuit emulation; and providing input signals to the at least one circuit emulation resource to emulate a portion of an electronic circuit; and receiving output signals the at least one circuit emulation resource produces in response to the input signals to perform circuit emulation.

14. The method according to claim 13, wherein the first interconnection interface is on a first side of the first circuit board, the second interconnection interface is on a second side of the first circuit board, and the first interconnection interface communicates signals independently from the second interconnection interface.

15. The method according to claim 13, further comprising using an interface protocol circuit for receiving and processing at least a portion of the input signals.

16. The method according to claim 13, further comprising using a network interface circuit for receiving at least a portion of the input signals and transmitting at least a portion of the output signals in a packet form via a communication network, wherein the network interface circuit is on the first circuit board and coupled with the at least one circuit emulation resource.

17. The method according to claim 13, further comprising using a work station coupled with the first circuit board and with the at least one circuit emulation resource for providing programming signals to program the at least one circuit emulation resource.

18. The method according to claim 13, further comprising using a signal switching device coupled with the first circuit board, the second circuit board, and the third circuit board for routing signals to and from the first circuit board, the second circuit board, and the third circuit board.

19. The method according to claim 13, further comprising using a central signal switching device for routing signals to and from at least two clusters, wherein a first cluster comprises the signal switching device, the first circuit board, the second circuit board, and the third circuit board, and a second cluster comprises a second signal switching device coupled with a second group of circuit boards.

20. The method according to claim 13, further comprising using a clock circuit and a control circuit coupled with the first circuit board and coupled with the at least one circuit emulation resource.

21. The method according to claim 13, wherein at least one of the first interconnection interface and the second interconnection interface comprises a communication bus receiving and transmitting signals via at least one of fiber optics, conductive contacts, and cable connectors.

22. The method according to claim 13, wherein the first circuit board comprises a memory device coupled with the at least one circuit emulation resource, the memory device being configured as a data storage device of the at least one circuit emulation resource.

23. The method according to claim 13, wherein the at least one circuit emulation resource comprises a plurality of programmable logic devices each having terminals for receiving its input signals and transmitting its output signals, and wherein the conductive wiring paths of the first circuit board are configured to link a portion of the terminals between the plurality of programmable logic devices.

24. The method according to claim 23, wherein the plurality of programmable logic devices comprise field-programmable gate arrays.

25. A method for making an integrated circuit using a computer system comprising a processor and a memory encoded with program instructions that, when executed by the processor, cause the system to perform the method, the method comprising a circuit emulation process comprising:

configuring, by the processor, at least one circuit emulation resource on a first circuit board having a first group of conductive wiring paths, the circuit emulation resource being coupled with a portion of the conductive wiring paths of the first group of conductive wiring paths, each circuit emulation resource being configured to emulate a portion of an electronic circuit;

coupling a first interconnection interface on the first circuit board with an interconnection interface of a second circuit board having a second group of conductive wiring paths and having a second group of circuit emulation resources, wherein the first interconnection interface is coupled with at least a first portion of the at least one circuit emulation resource;

coupling a second interconnection interface on the first circuit board to an interconnection interface of a third circuit board having a third group of conductive wiring paths and having a third group of circuit emulation resources, wherein the second interconnection interface is coupled with at least a second portion of the at least one circuit emulation resource, wherein the first interconnection interface and the second interconnection interface have at least one of non-overlapped signaling paths and provide at least a structural support for coupling the first, second, and third circuit boards and enabling structural stackability of the apparatus for circuit emulation;

providing input signals to the at least one circuit emulation resource to emulate a portion of an electronic circuit; and receiving output signals the at least one circuit emulation resource produces in response to the input signals to perform circuit emulation.

26. The method according to claim 25, further comprising changing at least one of designs of the integrated circuit based on the circuit emulation.

27. The method according to claim 25, further comprising fabricating the integrated circuit after the circuit emulation.

28. The method according to claim 25, wherein the first interconnection interface is on a first side of the first circuit board, the second interconnection interface is on a second side of the first circuit board, and the first interconnection interface communicates signals independently from the second interconnection interface.

29. The method according to claim 25, further comprising using an interface protocol circuit for receiving and processing at least a portion of the input signals.

30. The method according to claim 25, further comprising using a work station coupled with the first circuit board and with the at least one circuit emulation resource for providing programming signals to program the at least one circuit emulation resource.

31. The method according to claim 25, further comprising using a signal switching device coupled with the first circuit board, the second circuit board, and the third circuit board for routing signals to and from the first circuit board, the second circuit board, and the third circuit board.

32. The method according to claim 25, further comprising using a central signal switching device for routing signals to and from at least two clusters, wherein a first cluster comprises the signal switching device, the first circuit board, the second circuit board, and the third circuit board, and a second cluster comprises a second signal switching device coupled with a second group of circuit boards.

33. The method according to claim 25, wherein at least one of the first interconnection interface and the second interconnection interface comprises a communication bus receiving and transmitting signals via at least one of fiber optics, conductive contacts, and cable connectors.

* * * * *